United States Patent
King

(10) Patent No.: US 6,744,386 B2
(45) Date of Patent: Jun. 1, 2004

(54) PREVENTION OF INCOMPATIBLE KEYBOARD SELECTIONS FROM BEING ENTERED DURING POWER INITIALIZATION

(75) Inventor: Dale Wayne King, Indianapolis, IN (US)

(73) Assignee: Thomson Licensing, S.A., Boulogne-Billancourt (FR)

( * ) Notice: Subject to any disclaimer, the term of this patent is extended or adjusted under 35 U.S.C. 154(b) by 571 days.

(21) Appl. No.: 09/809,508

(22) Filed: Mar. 15, 2001

(65) Prior Publication Data

US 2001/0054971 A1 Dec. 27, 2001

Related U.S. Application Data

(60) Provisional application No. 60/208,754, filed on Jun. 2, 2000.

(51) Int. Cl.⁷ .................... H03K 17/94; H03M 11/00
(52) U.S. Cl. ............................................ 341/22; 400/472
(58) Field of Search ............................. 341/26, 22, 24; 400/472; 345/168

(56) References Cited

U.S. PATENT DOCUMENTS

| | | | | |
|---|---|---|---|---|
| 4,194,425 A | * | 3/1980 | Kitagawa ................... 84/684 |
| 4,409,665 A | * | 10/1983 | Tubbs ....................... 713/321 |
| 4,518,951 A | * | 5/1985 | Backes ....................... 341/26 |
| 4,581,603 A | | 4/1986 | Ingold et al. ............ 340/365 E |
| 4,649,373 A | | 3/1987 | Bland et al. ............. 340/365 R |
| 4,667,181 A | * | 5/1987 | Hastreiter .................... 341/26 |
| 4,906,993 A | * | 3/1990 | Freeman et al. ............... 341/26 |
| 4,918,445 A | * | 4/1990 | Bower ......................... 341/26 |
| 5,065,356 A | * | 11/1991 | Puckette ..................... 710/240 |
| 5,081,453 A | * | 1/1992 | Endoh et al. .................. 341/22 |
| 5,235,635 A | | 8/1993 | Gulick ........................ 379/368 |
| 5,264,845 A | | 11/1993 | Kwon et al. ................... 341/26 |
| 5,349,344 A | | 9/1994 | Head ...................... 340/825.23 |
| 5,381,142 A | | 1/1995 | Simmons, Jr. ................. 341/26 |
| 5,451,953 A | | 9/1995 | Duffield ..................... 341/176 |
| 5,512,893 A | * | 4/1996 | Gulick ........................ 341/26 |
| 5,521,575 A | * | 5/1996 | Pack .......................... 341/26 |
| 5,783,874 A | | 7/1998 | Gaglione et al. ............. 307/113 |
| 6,075,390 A | | 6/2000 | Shin et al. .................... 327/74 |
| 6,104,320 A | | 8/2000 | Tu et al. ..................... 341/26 |

* cited by examiner

Primary Examiner—Timothy Edwards
(74) Attorney, Agent, or Firm—Joseph S. Tripoli; Joesph J. Laks; Reitseng Lin

(57) ABSTRACT

A control system for an apparatus wherein a keyboard for user selection has a plurality of first lines and a plurality of second lines coupled to a programmable microprocessor. The keyboard includes a plurality of switch elements arranged to selectively connect a particular one of the plurality of first lines to a particular one of the set of second lines. The control system is disabled while powering-up so that incompatible keyboard selections cannot be entered by the user.

8 Claims, 2 Drawing Sheets

US 6,744,386 B2

PREVENTION OF INCOMPATIBLE KEYBOARD SELECTIONS FROM BEING ENTERED DURING POWER INITIALIZATION

CLAIM OF PRIORITY

Priority is claimed from U.S. provisional patent application No. 60/208,754 filed Jun. 2, 2000.

FIELD OF THE INVENTION

The present invention relates to apparatus which have a keyboard for inputting information/commands to the device, and more particularly, to the prevention of a user from inputting incompatible information/commands during power-up of the apparatus.

BACKGROUND

Scanned matrix keyboards are almost universally employed in control system which include microcontrollers, due to the efficiency of scanned matrix keyboards in minimizing the number of wire connections required. In a scanned matrix keyboard, a set of drive lines and a set of sense lines are logically organized as rows and columns, and each of a plurality of individual key switches is electrically positioned at the intersection between a particular drive line and a particular sense line to electrically and logically connect a particular sense line to a particular drive line to define a matrix intersection point when the switch is actuated by a user.

Thus a coding pattern is established from an encoding set including connection of a sense line to at least a particular one of the set of drive lines according to the programming of the microprocessor. Conventional practice is to periodically scan the keyboard, e.g., by momentarily applying a bias or signal to each of the drive lines in sequence, while monitoring all of the sense lines in synchronism with the activation of the drive lines, and thereby determining which particular key is being actuated.

With television receivers/players, e.g., color television receiver, VCR, DVD players, if a user by chance happens to press a particular combination of keyboard keys while powering-up the device, the receiver may switch into an undesirable service mode, which is intended to be used only during factory production set-up procedures. Once the television receiver is switched into such a service mode, the user is very confused, and is unable to use the keys to switch out from the service mode, i.e., the user does not know that he/she must disconnect the AC power cord from the AC power, and should wait until capacitors within the television receiver discharge before re-inserting the AC plug. It is desirable to avoid this situation from occurring.

SUMMARY OF THE INVENTION

A control system for an apparatus wherein a keyboard for information or command input has a plurality of drive lines and a plurality of sense lines coupled to a programmable microprocessor. The keyboard includes a plurality of switch elements arranged to selectively connect a particular one of the plurality of drive lines to a particular one of the set of sense lines. The programming of the microprocessor disables the control system during power-up to prevent incompatible user input during initialization.

BRIEF DESCRIPTION OF THE DRAWINGS

Referring now to the drawings wherein.

DETAILED DESCRIPTION OF THE PREFERRED EMBODIMENT(S)

Figure 1:
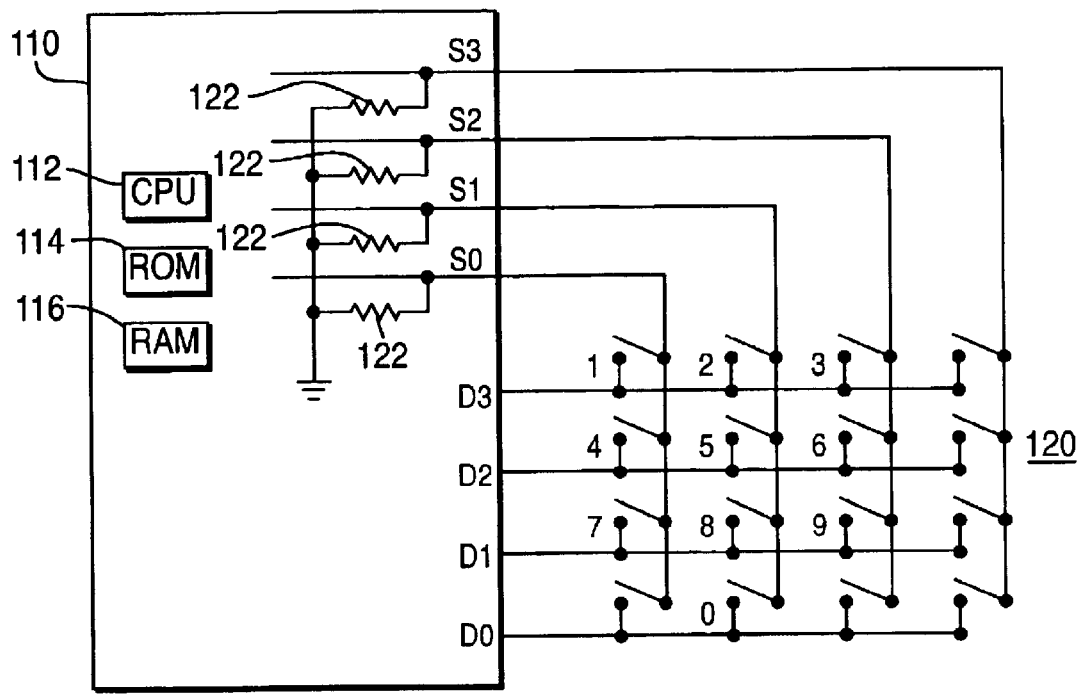
FIG. 1 is a schematic representation of a prior art keyboard with a microprocessor.

FIG. 1 shows an exemplary prior art keyboard arrangement wherein keyboard 120 includes, for example, sixteen keys, and has four drive lines coupled to controller 110 at ports D0–D3, and four sense lines coupled to controller 110 at ports S0 through S3. Microcomputer 110 includes a central processing unit (CPU) 112, a read only program memory (ROM) 114, and a random-access memory (RAM) 116. ROM 114 can be either internal or external to microprocessor 110, and can contain preprogrammed control codes. Pull-down resistors 122 can be internal (as shown here) of microprocessor 110 or external (not shown), or pull-up resistors can be used. Such resistors assure that a line goes to one state to another when no button is pressed, and thus assures that a known result is achieved with the pressing of a key/button.

In operation keyboard 120 is scanned by microprocessor 110 which sets bidirectional I/O ports (i.e., sense lines) S0 through S3 to the input mode, and in turn, applies sequential high level signals to drive lines D0 through D3 in an output mode. Thus, drive lines D0 through D3 produce a logic level 1 output. After the high level signal is moved from one drive line to another, each of sense lines S0 through S3 is read to see if a high level signal is present. Controller 110 can determine which key is pressed because each key affects a unique drive line/sense line pair.

Figure 2:
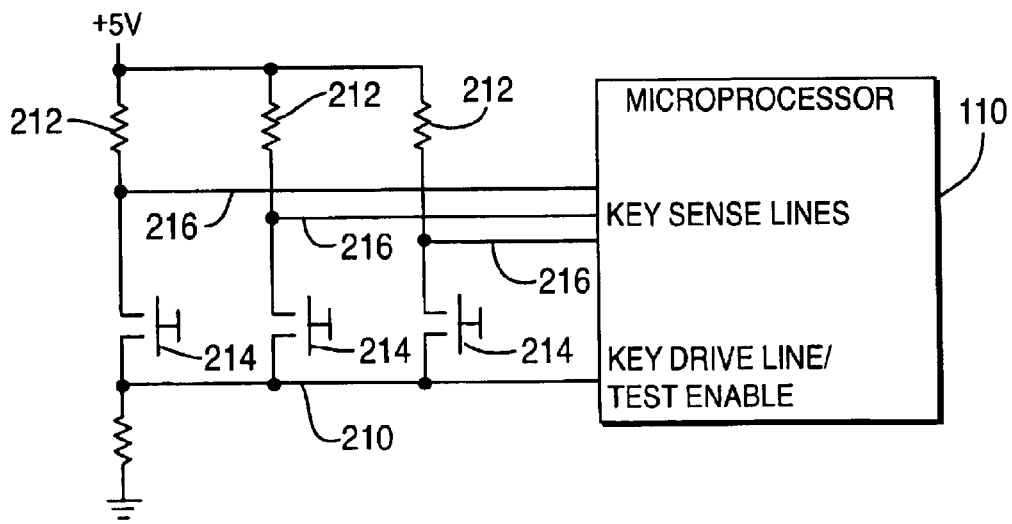
FIG. 2 is a partial schematic representation according to aspects of the present invention.

Referring now to FIG. 2, scanned keyboard drive line 210 in normal operation is a general purpose input/output (GPIO) configuration used to distinguish between switches connected to the keyboard sense inputs. However, the keyboard drive line herein also serves a dual purpose. If keyboard drive line 210 is driven "high" during initialization, i.e., by the user depressing an appropriate key 214 on the keyboard connecting a respective pull-up resistor 212 to drive line 210, operational microprocessor 110 is programmed to enter a special test mode which is reserved for use during factory testing here the drive line is externally driven "high" by a test fixture using an external voltage source.

To prevent the apparatus from entering this special testing mode due to keyboard input, operational microprocessor 110, by virtue of its programming, reconfigures the keyboard sense lines as output lines rather than input lines, and sets them to a low state before reading drive line 210. To test for the special test mode enable, the drive line is made an input terminal of microprocessor 110. With the sense lines 216 being driven low and sinking most of the current from respective pull-up resistors 212, the pressing of a key 214 will not cause the software to enter the special test mode, i.e., drive line 210 will not be driven "high". Thus, when sense lines 216 are programmed to be low, the keyboard is disabled, and when a key is pressed during power-up, the keyboard will not work while initialization is in process. In this way, drive line 210 cannot be driven "high" by use of the keyboard, but only by the external voltage source. Once drive line 210 has been read during power-up, and it is not "high", operational microprocessor 110 executes its programming, and makes sense lines 216 input terminals and makes the drive line(s) output terminals once again for normal functioning, i.e., a scanned keyboard as discussed above.

It should be noted that the present invention is equally applicable if logic levels are reversed, i.e., pull-up resistors are changed to pull-down resistors and a low level is required to enable the dual function for drive line 210. In that case normally, sense lines 216 would be driven low with the pressing of a key, and the drive line would be short circuited to ground by the test fixture, i.e., the external voltage source is zero volts.

The exemplary embodiment shows one drive line. If there are multiple drive lines, the other drive lines might also be set to be low during testing whether to enter the service mode even if only one of the drive lines is being monitored to determine whether to enter the service mode. Otherwise, multiple keys, simultaneously pressed, could cause another drive line to go high. For example in FIG. 1, if D0 is set high, pressing keys 0 and 8 could cause drive D1 to read high. Of course, if some drive lines are not coupled to the microprocessor, then their setting upon initiation is not relevant to the present problem unless a multiple key press can cause the problem discussed immediately above.

Additionally, for the purposes of the present invention, the set of drive lines can be considered to be interchangeable with the set of sense lines. The designation of an input line as a drive line or a sense line is just a matter of labeling.

Microprocessor 110 of the exemplary embodiment is an ST92196 made by the STMicroelectronics Co., formerly SGS Thomson Inc. An extensive data sheet is available from the manufacturer.

Figure 3:
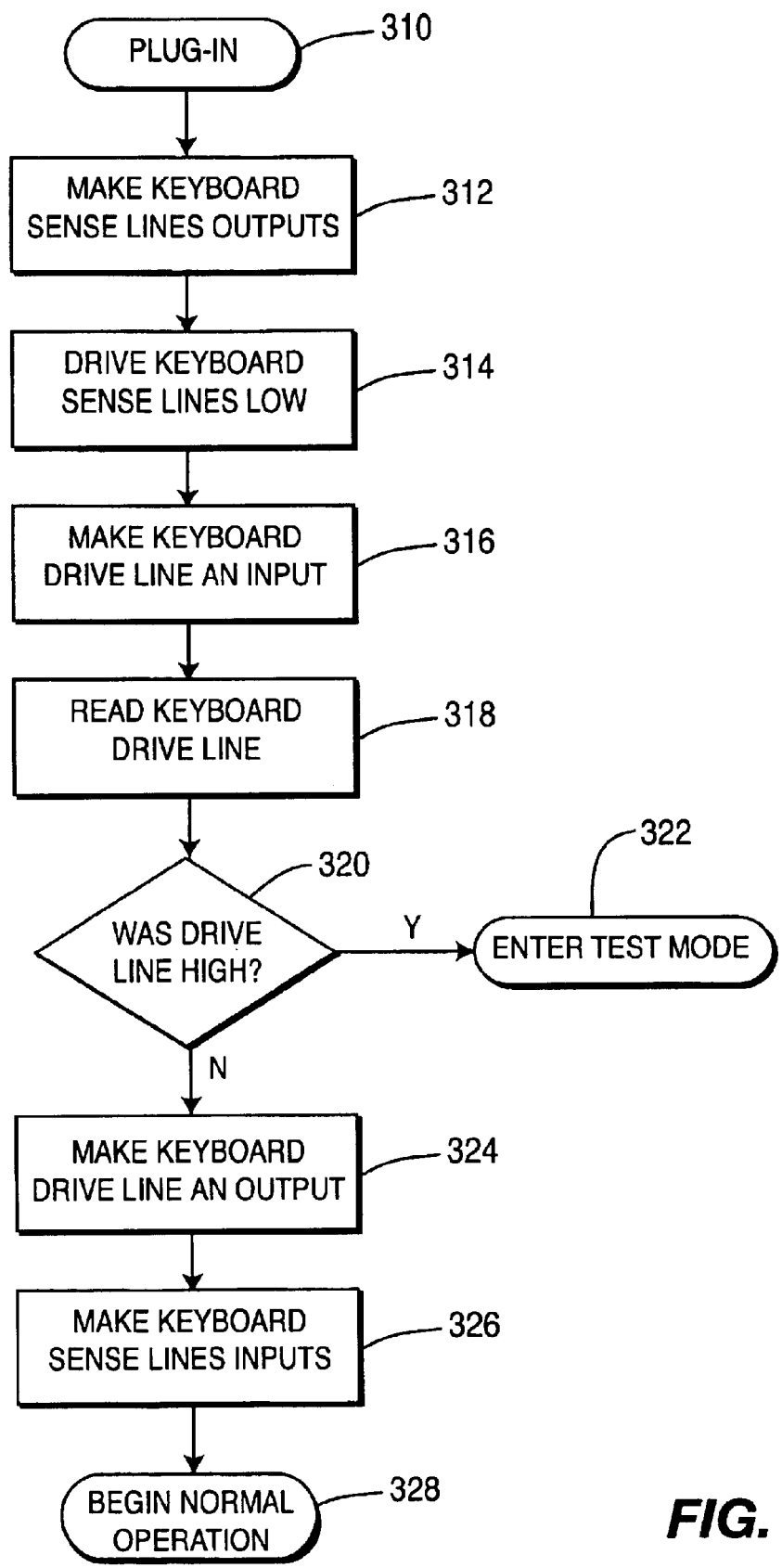
FIG. 3 is a flow chart of the microprocessor programming and of the operation of FIG. 2.

FIG. 3 shows a flow chart of the execution of the programming of microprocessor 110 and the operation of FIG. 2, according to aspects of the present invention. The set is AC plugged-in for receiving power at 310, the keyboard sense lines are made outputs at 312, the keyboard sense lines are driven low at 314, keyboard drive line is made an input at 316, and the keyboard drive line is read at 318. A decision is made at 320 depending upon whether the drive line is high, if yes, then the test mode is entered at 322, and if no, the keyboard drive line is made an output at 324, keyboard sense lines are made normal inputs at 326, and normal operation is begun at 328.

As used herein, the terms power-up, start-up, or initialization are interchangeable, and mean when the device is turned "on" after an application of newly provided AC power, such as when the apparatus is newly installed and the AC power supply is first switched "on", or after the AC power has been shut off by, e.g., pulling the AC plug, a tripped circuit breaker, a blown fuse, a power outage, etc. In such instances, the operational microprocessor executes its programming and disables the keyboard during initialization, as disclosed herein. Additionally, as used herein, the terms unwanted, undesirable, and incompatible are interchangeable.

What is claimed is:

1. A control system for an apparatus comprising:

a keyboard having a plurality of first lines and a plurality of second lines coupled to a programmable microprocessor;

the keyboard including a plurality of switch elements arranged to selectively connect a particular one of the plurality of first lines to a particular one of the set of second lines;

the control system being disabled during powering-up of the apparatus by the programming of the microprocessor.

2. A control system comprising:

a keyboard for user selection and having a plurality of first lines and a plurality of second lines coupled to a programmable microprocessor;

the keyboard including a plurality of switch elements arranged to selectively and electrically connect a particular one of the plurality of first lines to a particular one of the set of second lines;

at least one switch element providing a selection during powering-up which is incompatible with other user selections;

the control system being disabled during powering-up so that the incompatible keyboard selection cannot be entered by the user.

3. The control system of claim 1 or 2 wherein the disabling of the control system during power-up is accomplished by the microprocessor being programmed to make the first lines and second lines output lines from the microprocessor during power-up.

4. The control system of claim 3 wherein one of the first lines and second lines are changed to be input lines for normal user input after power-up.

5. The control system of claim 3 wherein the incompatible keyboard selection can be forced upon the control system during power-up by externally overriding the microprocessor programming.

6. The control system of claim 5 wherein the means for overriding the microprocessor programming comprises a source of voltage applied to at least one of the first lines and the second lines.

7. A control system comprising:

a keyboard for user selection and having a plurality of first lines and a plurality of second lines coupled to respective terminals of a programmable microprocessor;

the keyboard including a plurality of switch elements, at least one switch element arranged to selectively connect a particular one of the plurality of first lines to a particular one of the set of second lines;

the control system being disabled while powering-up so that incompatible keyboard selections cannot be entered by the user because the microprocessor is programmed to configure one of the first lines and the second lines to be output lines during power-up.

8. A control system comprising:

a keyboard having a plurality of first lines and a plurality of second lines coupled to respective terminals of a programmable microprocessor;

the keyboard including a plurality of switch elements, at least one switch element arranged to selectively connect a particular one of the plurality of first lines to a particular one of the set of second lines;

one of the first lines and the second lines being configured as output lines during power-up and configured as input lines after power-up.

* * * * *